United States Patent [19]
Guest

[11] 4,245,354
[45] Jan. 13, 1981

[54] RADIO FREQUENCY REGENERATORS

[75] Inventor: Ashley W. Guest, Bristol, England

[73] Assignee: British Aerospace, Surrey, England

[21] Appl. No.: 884,208

[22] Filed: Mar. 7, 1978

[30] Foreign Application Priority Data

Mar. 17, 1977 [GB] United Kingdom ............... 11282/77

[51] Int. Cl.³ .............................................. H04B 1/26
[52] U.S. Cl. ..................................... 455/259; 455/20; 455/263; 455/313
[58] Field of Search ............... 325/330, 420, 421, 419, 325/418, 422, 423, 432, 430, 433, 8, 9, 11, 346, 431; 343/5 AF, 17.1 R, 7.5; 455/19, 20, 22, 203, 208, 209, 257–265, 313–316

[56] References Cited
U.S. PATENT DOCUMENTS

| | | | |
|---|---|---|---|
| 2,270,023 | 1/1942 | Ramsay et al. | 325/433 |
| 3,460,040 | 8/1969 | Jacob | 325/8 |
| 4,083,014 | 4/1978 | Guest | 331/1 A |
| 4,092,602 | 5/1978 | Nishioka et al. | 325/346 |

*Primary Examiner*—Marc E. Bookbinder
*Attorney, Agent, or Firm*—Stevens, Davis, Miller & Mosher

[57] ABSTRACT

In a radar or radio frequency signal regenerator an incoming RF signal is mixed with the output of a single-side-band generator to produce a derived IF signal. The single-side-band generator operates to mix together the outputs of two local oscillators to provide the signal mixed with the incoming RF signal. A frequency lock loop circuit is used to compare the frequency of the derived IF signal with a reference IF frequency and the frequency of one of the local oscillators is varied to correct any frequency error and thus to make the frequency of that local oscillator equal to the incoming RF frequency.

6 Claims, 3 Drawing Figures

RADIO FREQUENCY REGENERATORS

The invention relates to frequency regenerators of the type for retransmitting received radio or radar signals. An object provided with such a frequency regenerator instead of merely reflecting a radar signal is able to actively respond to the signal.

The frequency regenerator, also known as an active enhancer or responder, has the advantage of considerably extending the range over which an object may be detected or controlled by radar. Furthermore, a regenerated frequency can be transmitted after a variable delay or another frequency having a variable offset with respect to the received frequency may be generated, again with or without a variable delay.

In accordance with the present invention a method of regenerating an incoming RF frequency in a radio or radar receiver includes mixing an incoming RF signal with the output of a single-side-band generator to derive an IF frequency, the single-side-band generator operating to mix the output of a first local oscillator with the output of a second local oscillator, and varying the frequency of the first local oscillator until the derived IF frequency is equal to a reference IF frequency, whereby the frequency of the first local oscillator is equal to the incoming RF frequency.

The frequency of the second local oscillator alternatively may be fixed at a reference IF frequency or may be varied until it is equal to a reference IF frequency. Where the incoming RF signal is pulsed and the frequencies of both first and second local oscillators are variable the method of regenerating the incoming RF frequency includes varying the frequency of the second oscillator only when an incoming RF pulse is not present, and varying the frequency of the first oscillator when an RF pulse is present.

A preferred circuit for carrying out the method of the invention includes a mixer for mixing the incoming RF signal with the output of a single-side-band generator to produce a derived IF signal, the single-side-band generator mixing the output of a variable frequency first local oscillator with the output of a second local oscillator, a frequency lock loop for comparing the frequency of the derived IF signal with a reference IF frequency to produce a frequency error signal connected to control the frequency of the variable frequency first local oscillator. Where the second local oscillator also has a variable frequency output the circuit further includes getting means for alternatively connecting the derived IF signal or the output of the second local oscillator to the input of the frequency lock loop, and for corresponding connecting the output of the frequency lock loop to the first local oscillator or the second local oscillator. If the incoming RF signal is pulsed the circuit preferably includes sequence control means, responsive to an RF pulse detector, for carrying out the alternative switching functions to control the frequencies of the first and second local oscillators.

In a pulsed RF system frequency lock can be achieved rapidly, i.e. during the period of one RF pulse, by using a frequency lock loop having a very fast response time. The RF input can then be inhibited when the frequency of the first local oscillator has been set and subsequent re-transmission can be carried out immediately, or after a chosen delay, and at the same or a shifted RF frequency.

The RF frequency bandwidth of the system may be extended by including in the sequence control means a search sweep circuit operative to initially sweep the frequency of the first local oscillator through an appropriate frequency band, the search sweep being discontinued when a derived IF signal lying within the IF bandwidth of the system is detected.

The preferred example of the invention will now be described with reference to the accompanying drawings in which.

Figure 1:
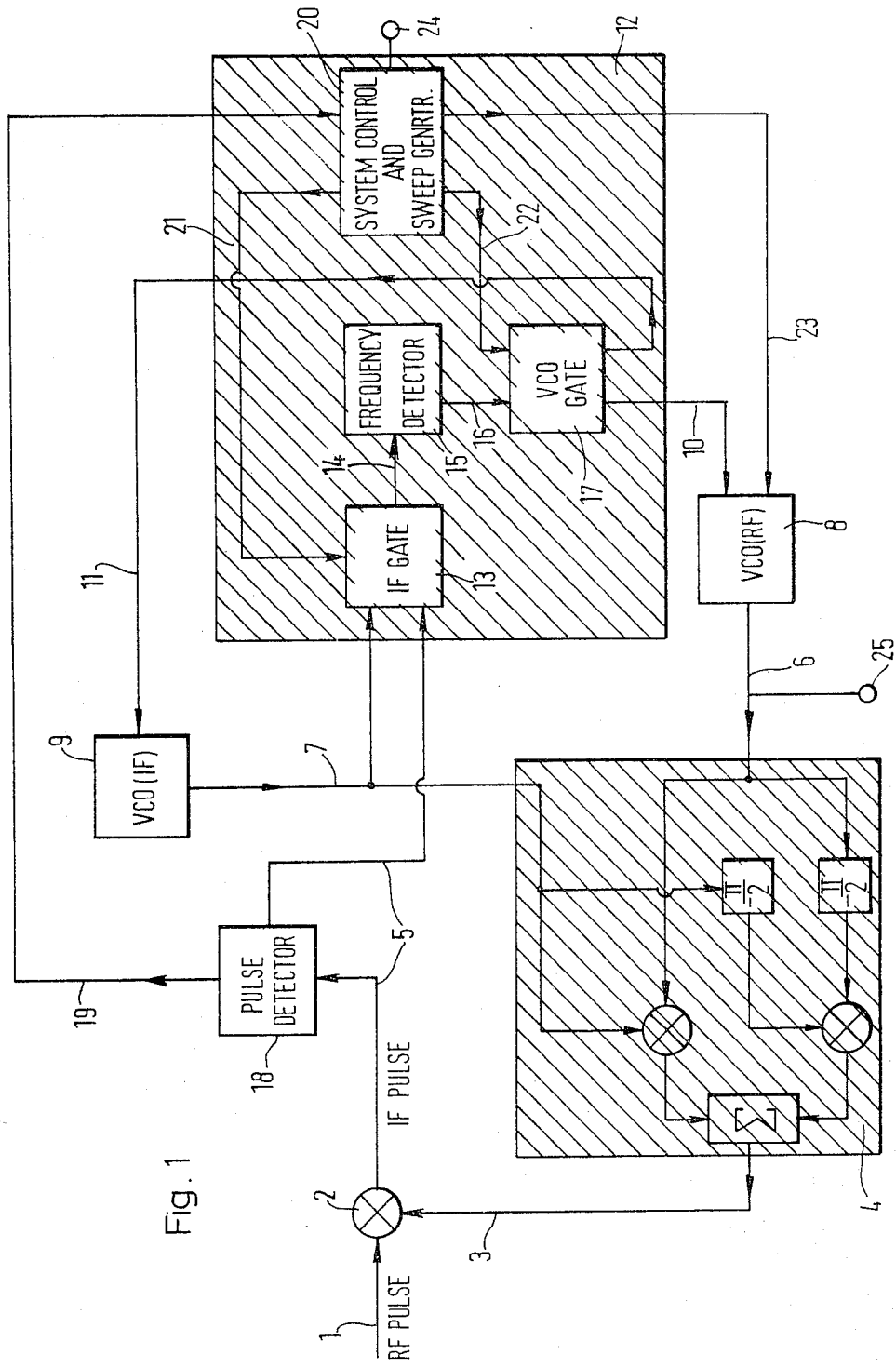
FIG. 1 shows a block diagram of the regenerator.

The frequency regenerator circuit shown in FIG. 1 is essentially a type of heterodyne circuit in which a received RF signal 1 is mixed by mixer 2 with the output 3 of a known signel-side-band generator, indicated by the shaded block 4, to produce a derived IF signal 5. The single-side band signal 3 is generated by the circuit shown within block 4 by mixing the output signals 6 and 7 from two voltage controlled local oscillators 8 and 9 respectively. The voltage control signals 10 and 11 for the local oscillators 8 and 9 respectively are produced by a frequency detecting means indicated by the shaded block 12.

The frequency lock loop 12 operates on a time-sharing basis to produce the control or error signals 10 and 11 as follows: initially, the output 7 of the local oscillator 9 is connected through a gating circuit 13 to the input 14 a frequency detector 15 which effectively compares the frequency of output 7 with an internal reference frequency and generates an error signal accordingly at its output 16. This error signal is gated by a gating circuit 17 to provide the control singal 11 which alters the frequency of oscillator 9 so as to reduce the frequency error.

On receiving an RF signal the gating circuit 13 removes the signal 7 from the input 14 to the frequency detector 15 and connects instead the derived IF signal 5. The frequency detector compares the frequency of this signal to its internal reference and produces an error signal at its output 16 which is now gated by the gate 17 to provide the control signal 10 for oscillator 8 altering the frequency of the oscillator so as to reduce the frequency error of the derived IF signal 5.

The result of this cycle of operations is that the frequency of oscillator 8 is equal to the incoming RF frequency of signal 1 so that the output signal 6, from oscillator 8, may be used as the regenerated RF frequency signal.

Figure 3:
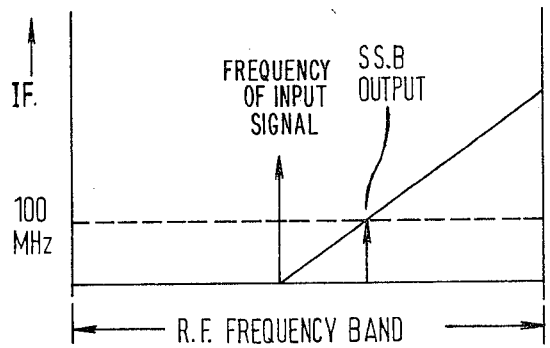
FIG. 3 shows an RF versus IF frequency diagram for the single-side-band generator.
Figure 2:
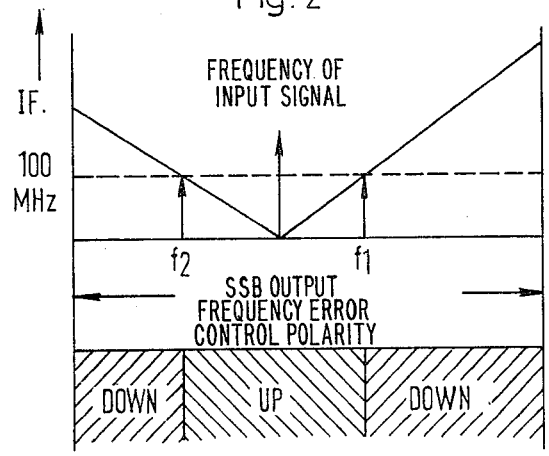
FIG. 2 shows an RF versus IF frequency diagram of the regenerator, and an error voltage polarity diagram for the frequency lock loop.

In this embodiment the incoming RF signal 1 is of a pulsed form, thus, the mixer 2 feeds the derived IF signal 5 directly into a pulse detector 18 which only relays the IF signal 5 to the frequency lock loop 12 when a pulse is detected. The pulse detector 18 also generates an indicating signal 19 connected to a control circuit 20, in the frequency lock loop 12, which controls the gates 13 and 17 by means of control signals 21 and 22 respectively. In addition, the control circuit 20 generates a ramp control signal 23 connected to a second control input of oscillator 8, enabling the frequency of signal 6, and hence the signal 3, to be swept through a frequency band appropriate to the RF frequency band of the receiver. This part of the operation of the receiver is illustrated in FIGS. 2 and 3 to which further reference will be made below.

The control circuit 20 comprises a conventional logic circuit responsive to the pulse detector signal 19 to generate the control signals 21 and 22 which determine the state of the gates 13 and 17. It also includes a saw-tooth voltage waveform generator the output of which is gated by a gating circuit which may be latched into a conducting state by a command signal input 24 and unlatched by the logic circuit in response to the pulse detector signal 19. Preferably the command signal input 24 resets the saw-tooth generator to the voltage level corresponding to the highest frequency of oscillator 8 so that a decreasing frequency sweep can begin immediately.

In operation, when there is no received signal 1 the circuit of FIG. 1 occupies an "idle state" in which oscillator 9 is connected to the frequency lock loop 12 and the feedback error signal 16, via gate 17, maintains the frequency of the oscillator output 7 at any convenient "idle frequency" within the IF frequency band set by the internal reference of the frequency detector 15.

A frequency sweep search for an RF signal is initiated by a "Search Sweep" command signal input 24 to the control circuit 20. On receipt of such a signal, the control circuit output 23 resets oscillator 8 to the highest frequency within the RF band, shown to right-hand side of the diagram in FIG. 2, and commences to sweep towards the lowest RF frequency, i.e. to the left. The sweep continues until the pulse detector circuit 18 detects an IF signal 5 lying within the IF bandwidth of the system. The indicating signal 19 is then generated stopping the sweep by control circuit 20 and allowing the frequency lock loop 12 to take over. The gates 13 and 17 are switched to connect the IF signal 5 to the frequency detector 15 and the error signal 16 to the oscillator 8, the latter signal tending to zero as the derived IF signal 5 approached the required If frequency of 100 MHz in FIG. 2.

The polarity of the error signal 10 is changed according to the frequency of the incoming RF signal as shown in the control polarity diagram in FIG. 2. If the RF frequency lies above $f_1$ the frequency of oscillator 8 is decreased, if it lies below $f_2$ the frequency is also decreased to its minimum, then reset to its maximum and finally decreased again to the correct value. Only if the RF frequency lies between $f_1$ and $f_2$ is the frequency of oscillator 8 increased to give the correct value.

Thus, as FIG. 2 indicates, there are two frequencies of the signal 3 which yield the 100 MHz IF frequency. However, only one of the frequencies provides stable locking of signal 3 frequency with the incoming signal 1.

FIG. 3 shows a frequency plot of the output 3 of the single-side-band generator 4 against a received RF signal 1, where the diagonal line is the projection of the frequency deifference between the RF input 1 and the output 3 from the generator 4 on to the Y axis, labelled IF. Considered together with the control polarity diagram of FIG. 2 it will be appreciated that there is only one output frequency from oscillator 8 which can produce the required IF, and that the error signal 10 ensures that when an RF signal is detected the output 6 always converges towards that frequency.

Once the regenerator circuit has converged to the correct IF frequency the frequency of oscillator 8 is equal to the incoming RF frequency. As previously mentioned this can be re-transmitted directly using the signal at output terminal 25 in FIG. 1, or this signal may be used as the basis for a frequency transformation, by means of for example frequency addition or subtraction, before re-transmission. Furthermore delay means may be included in the re-transmitting apparatus (not shown) for the purpose of delaying the transmitted response of the regenerator.

I claim:

1. A method of regenerating an incoming R.F. signal in a radio or radar receiver, the method comprising:
   combining the outputs of a first and a second local oscillator in a single sideband generator to form a mixing signal, the first local oscillator being operable for producing a variable frequency R.F. output and the second local oscillator being operable for producing an output at an I.F. reference frequency;
   mixing said mixing signal with said incoming R.F. signal to produce a derived I.F. signal, and
   varying the output frequency of said first local oscillator to cause the frequency of said derived I.F. signal to become equal to said I.F. reference frequency and, thereby, to cause the output frequency of said first local oscillator to become equal to the frequency of said incoming R.F. signal.

2. A method according to claim 1, wherein the output frequency of said second local oscillator is variable and wherein the method includes generating a fixed I.F. reference signal and, on a time-sharing basis, comparing the output of the second local oscillator with said fixed I.F. reference signal and varying the frequency of the second local oscillator until it equals that of the reference signal and then, when an incoming R.F. signal is received, comparing said derived I.F. signal with the reference signal and varying the frequency of the first local oscillator until the frequency of the derived I.F. signal equals that of the reference signal.

3. A frequency regenerator comprising:
   a first local oscillator which is operable for producing a variable frequency R.F. output;
   a second local oscillator which is operable for producing an output at an I.F. reference frequency;
   a single-sideband generator connected to said first and second local oscillators and operable for combining the outputs therefrom to form a mixing signal;
   mixing means connected to said single-sideband generator and operable for mixing said mixing signal with and incoming R.F. signal to produce a derived I.F. signal, and
   frequency comparison and oscillator control means connected to said mixing means and operable for comparing the frequency of said derived I.F. signal and said I.F. reference frequency to produce a frequency error signal and, in response to said frequency error signal, for varying the frequency of the first local oscillator to cause the frequency of said derived I.F. signal to become equal to said I.F. reference frequency and, thereby, to cause the frequency of the first local oscillator to become equal to the frequency of said incoming R.F. signal.

4. A frequency regenerator according to claim 3, wherein the frequency of said second local oscillator is variable and wherein the regenerator includes gating means connected to said mixer, said first and second local oscillators, and said comparison and control means for being operable, on a time sharing basis, for connecting the second local oscillator to said comparison and control means for the frequency of the second local oscillator to be made equal to said I.F. reference frequency and, when an incoming R.F. signal is received, for connecting said mixer and said first local oscillator to said comparison and control means whereby the frequency of the first local oscillator is varied until the frequency of the derived I.F. signal equals said I.F. reference frequency.

5. A frequency regenerator according to claim 4 for receiving an incoming pulsed RF signal further includes pulse detector means connected to receive the derived IF signal and operative to produce an output signal when an IF signal pulse is detected, and sequence control means connected to the output of the pulse detector means and arranged to control a gating means such that when an RF signal pulse is present the first local oscillator is connected in circuit with the frequency comparison means and when an RF signal pulse is not present the second local oscillator is connected in circuit with the frequency comparison means.

6. A frequency regenerator according to claim 5 wherein the sequence control means includes frequency sweep control means operative when an RF signal pulse is not present to sweep the output of the first local oscillator through a pre-determined frequency range.

* * * * *